United States Patent
Dauelsberg et al.

(10) Patent No.: US 8,157,915 B2
(45) Date of Patent: Apr. 17, 2012

(54) CVD REACTOR HAVING A PROCESS-CHAMBER CEILING WHICH CAN BE LOWERED

(75) Inventors: Martin Dauelsberg, Aachen (DE); Johannes Käppeler, Würselen (DE); Bernd Schulte, Aachen (DE)

(73) Assignee: Aixtron Inc., Sunnyvale, CA (US)

( * ) Notice: Subject to any disclaimer, the term of this patent is extended or adjusted under 35 U.S.C. 154(b) by 609 days.

(21) Appl. No.: 12/297,973

(22) PCT Filed: Apr. 17, 2007

(86) PCT No.: PCT/EP2007/053703
§ 371 (c)(1), (2), (4) Date: Oct. 21, 2008

(87) PCT Pub. No.: WO2007/122137
PCT Pub. Date: Nov. 1, 2007

(65) Prior Publication Data
US 2009/0064935 A1 Mar. 12, 2009

(30) Foreign Application Priority Data
Apr. 21, 2006 (DE) .......... 10 2006 018 515

(51) Int. Cl.
*B05D 3/06* (2006.01)
*H01L 21/44* (2006.01)
*C23F 1/00* (2006.01)
*C23C 16/00* (2006.01)

(52) U.S. Cl. ............... 118/725; 118/724; 156/345.52; 156/345.53

(58) Field of Classification Search .......... 118/724, 118/725; 156/345.52, 345.53
See application file for complete search history.

(56) References Cited

U.S. PATENT DOCUMENTS
4,047,496 A * 9/1977 McNeilly et al. ......... 118/725
5,399,387 A 3/1995 Law
(Continued)

FOREIGN PATENT DOCUMENTS
DE 101 03 341 A1 8/2001
(Continued)

OTHER PUBLICATIONS
Aixtron, AG; PCT/EP2007/053703 filed Apr. 17, 2007, International Search Report and Written Opinion, mailed Jul. 31, 2007, ISA/EP, 9pp.

*Primary Examiner* — Sylvia R. MacArthur
(74) *Attorney, Agent, or Firm* — SNR Denton US LLP

(57) ABSTRACT

The invention relates to an apparatus for the deposition of one or more layers on a substrate (4), which comprises a process chamber (2) which is arranged in a reactor housing (1) and has a heatable bottom (3) on which the substrate rests and a lid (5) extending parallel to the bottom (3) and also a gas inlet facility (6) for introduction of process gases. The distance (H) between the process chamber lid (5) and the process chamber bottom (3) can be reduced to virtually zero. A cooling apparatus (7) by means of which the process chamber lid (5) is cooled in the process position during deposition of the layers is provided above the process chamber lid (5), with the distance between the cooling apparatus (7) and the process chamber lid (5) increasing as the distance (H) between the process chamber lid (5) and the process chamber bottom (3) is reduced.

13 Claims, 4 Drawing Sheets

U.S. PATENT DOCUMENTS

| | | |
|---|---|---|
| 6,440,221 B2 | 8/2002 | Shamouilian |
| 6,514,073 B1 * | 2/2003 | Toshima et al. .................. 432/85 |
| 6,558,470 B2 * | 5/2003 | Curtis et al. .................. 118/500 |
| 6,705,394 B1 | 3/2004 | Moslehi et al. |
| 6,891,131 B2 * | 5/2005 | Sakuma et al. ............... 219/390 |
| 7,740,703 B2 | 6/2010 | Hasegawa |
| 2001/0018272 A1 | 8/2001 | Haji |
| 2003/0000469 A1 | 1/2003 | Pyo |
| 2004/0005731 A1 * | 1/2004 | Jurgensen et al. ............ 438/100 |
| 2004/0231599 A1 | 11/2004 | Schwambera |
| 2005/0199182 A1 | 9/2005 | Masuda |
| 2005/0242061 A1 | 11/2005 | Fukuda |
| 2006/0051966 A1 | 3/2006 | Or et al. |
| 2009/0064935 A1 * | 3/2009 | Dauelsberg et al. .......... 118/724 |

FOREIGN PATENT DOCUMENTS

| | | |
|---|---|---|
| DE | 102 11 442 | 9/2003 |
| DE | 101 33 914 | 12/2011 |
| JP | 05029302 A | 12/2011 |
| WO | 00/42236 | 7/2000 |
| WO | 03/063216 A1 | 12/2011 |

* cited by examiner

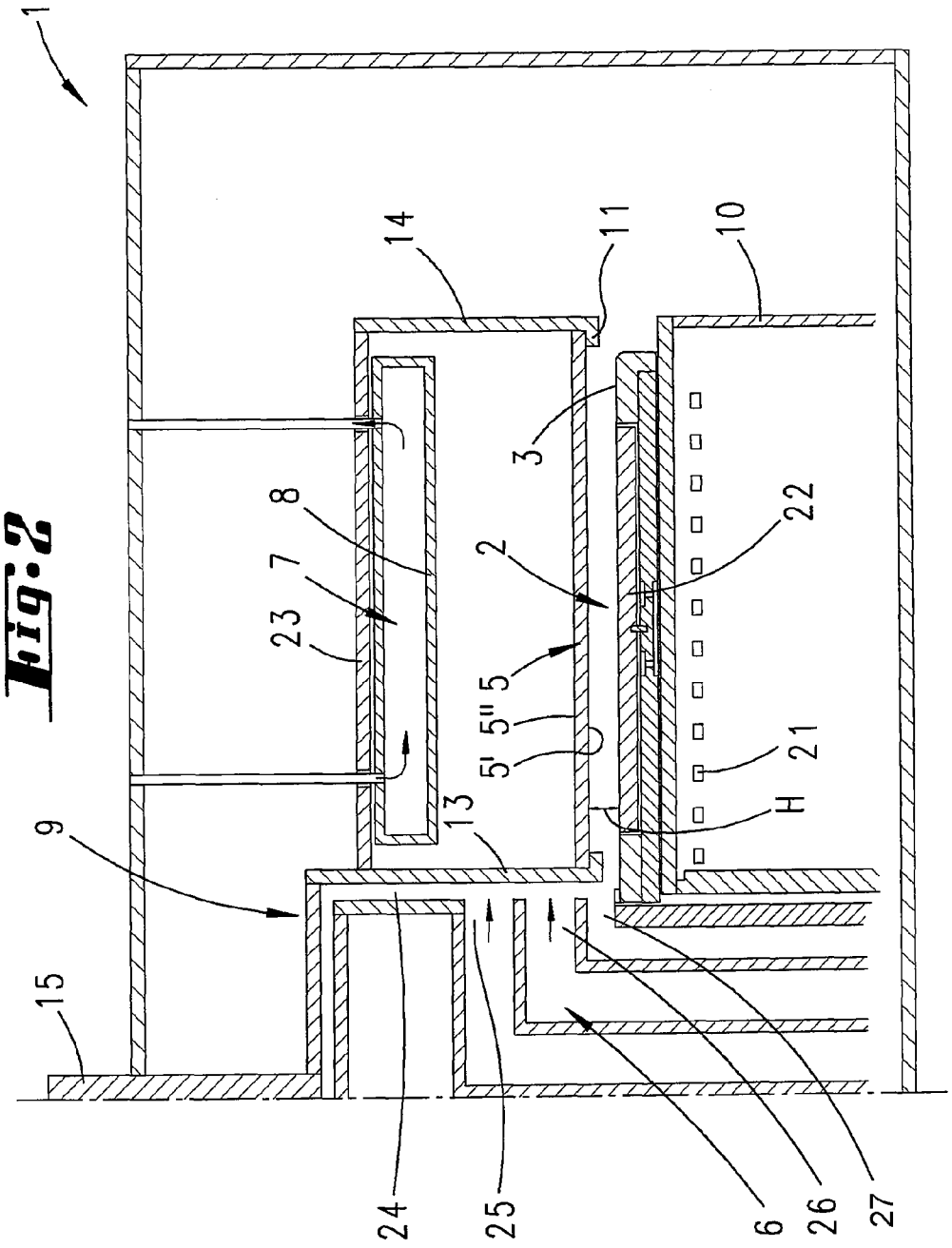

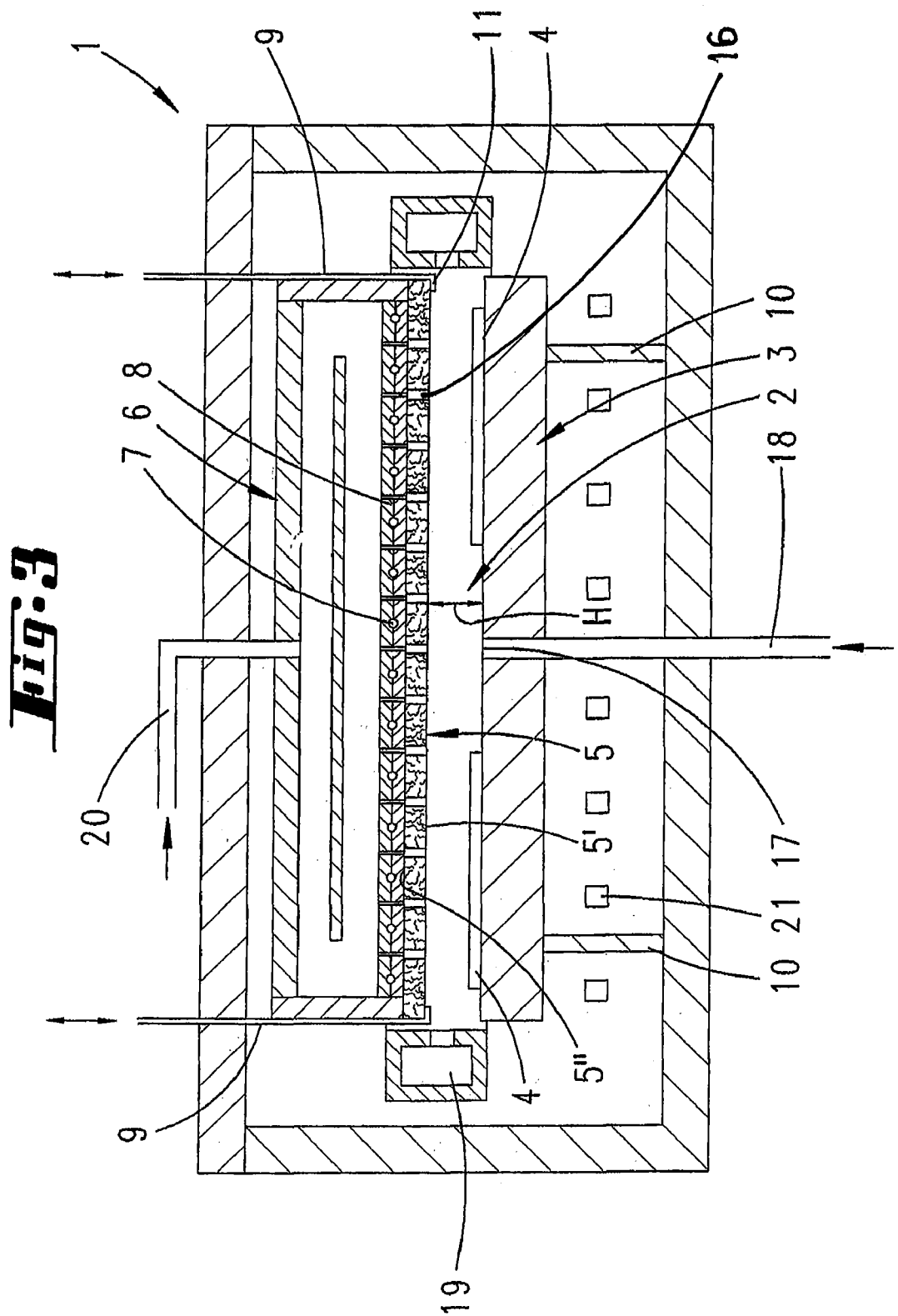

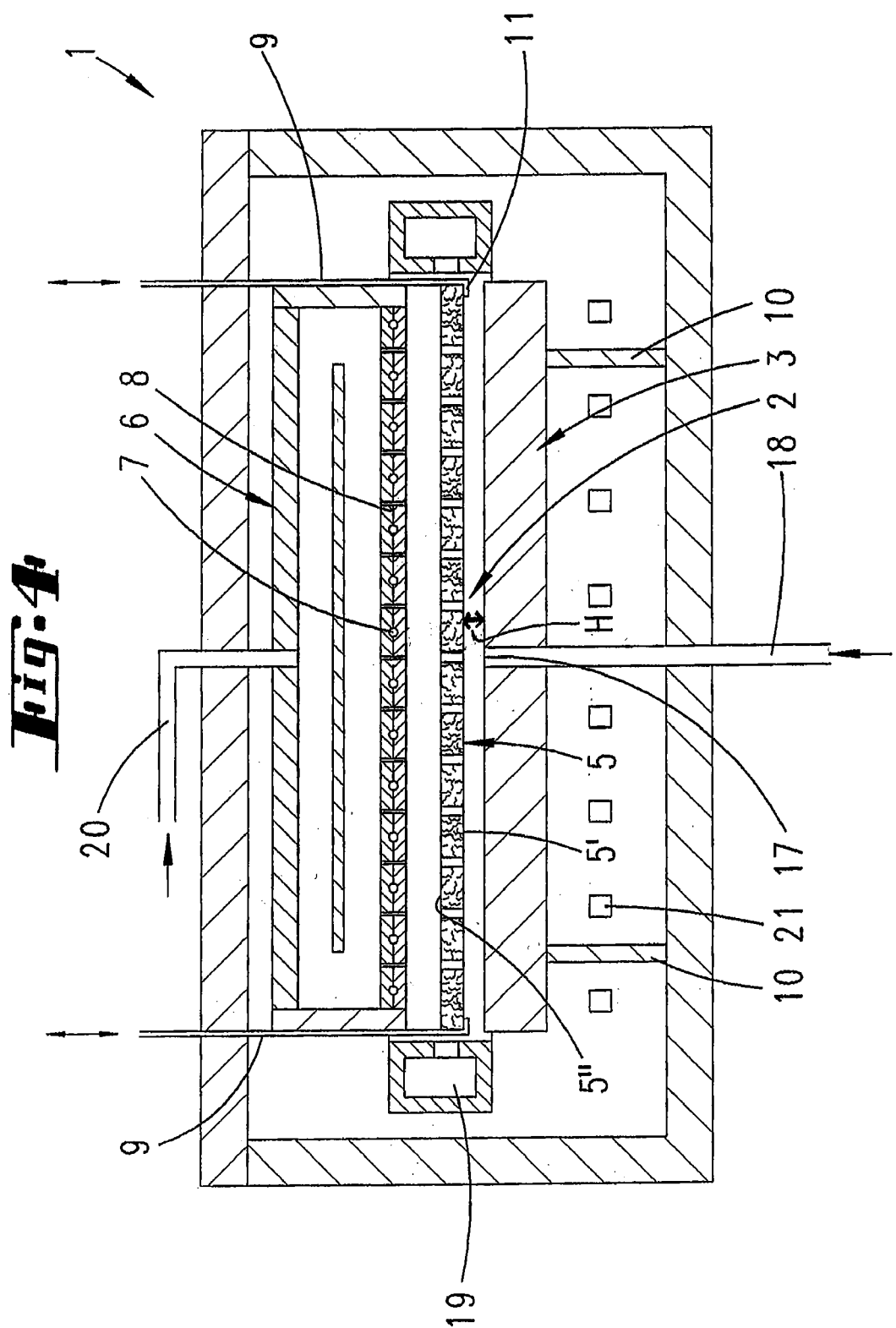

CVD REACTOR HAVING A PROCESS-CHAMBER CEILING WHICH CAN BE LOWERED

CROSS REFERENCES TO RELATED APPLICATIONS

The present patent application is a National Stage under 35 USC 365 and claims priority to PCT International Application No. PCT/EP2007/053703 filed Apr. 17, 2007, incorporated herein by reference, which claims priority benefit from German Application No.: 10 2006 018 515.3 filed Apr. 21, 2006.

The invention relates to an apparatus for depositing one or more layers on a substrate, having a process chamber which is disposed in a reactor housing and has a heatable floor, on which the substrate rests, and a ceiling, extending parallel to the floor, and also a gas-inlet means for introducing process gases, it being possible for the distance between the process-chamber ceiling and the process-chamber floor to be reduced to zero from a process position, in which the layers are deposited on the substrate, to a cleaning position, in which the process chamber is cleaned.

Such an apparatus is already known from US 2006/0051966 A1. A floor of a process chamber can be heated up. A process-chamber ceiling is located above the process-chamber floor. In a process position, in which process gases are introduced into the process chamber in order for layers to be deposited on substrates located there, the process chamber has a first height, which is defined by the distance between the process-chamber floor and process-chamber ceiling. Raising the process-chamber floor makes it possible to reduce the distance between the process-chamber ceiling and process-chamber floor. In this reduced-distance position, the process chamber assumes an etching position, in which the process chamber can be cleaned by virtue of an etching gas being introduced.

DE 101 03 341 A1 discloses a plasma-treatment apparatus in the case of which the distance between the process-chamber ceiling and process-chamber floor can be varied.

WO 03/063216 A1, U.S. Pat. No. 5,399,387, US 2005/0199182 A1, WO 00/42236, US 2003/0000469 A1, US 2005/0242061 A1 and JP 05029302 A likewise describe apparatuses which are intended for depositing layers on substrates in a process chamber and in the case of which the process-chamber height can be varied.

DE 102 11 442 A1 describes a CVD reactor having a reactor housing and a gas-inlet means disposed in the reactor housing. Process gases are introduced into a process chamber through this inlet means. The process chamber has a ceiling and a floor. The substrates lie on the floor. The floor is heated from beneath. The ceiling extends horizontally at a distance from the floor, and is parallel to the latter. The gas-inlet means, in this case, is located above the reactor ceiling. The latter has shower-head-like gas-outlet openings through which the process gases can enter into the process chamber.

DE 101 33 914 A1 discloses a CVD reactor in which the process gases are introduced into the center of the process chamber. Flow takes place horizontally through the process chamber in the radial direction. The process chamber is enclosed by a gas-outlet ring, by means of which the process gas is transported away.

It is an object of the invention to develop the apparatus of the generic type for carrying out a cold-wall-deposition process in which the process-chamber ceiling has to be actively cooled.

The object is achieved by the invention specified in the claims, and each claim constitutes an independent solution and can be combined in any desired form with any other claim.

According to the invention, the distance between the process-chamber ceiling and the process-chamber floor can be reduced to zero in order for a cleaning position to be reached. Only the floor of the process chamber is heated here. The process-chamber ceiling is actively cooled during the deposition process. A cooling assembly is provided for this purpose, and this assembly is disposed above the process-chamber ceiling in the reactor housing and may be fixedly located in the reactor. When the process-chamber ceiling is lowered in the direction of the process-chamber floor, the distance between the rear side and the cooling assembly increases, so that the cooling action of the cooling assembly in relation to the process-chamber ceiling is drastically reduced. All that is therefore required during the cleaning process, which is preferably an etching process, is for the process-chamber ceiling to be lowered. Means which, in the process position, retain the cooling assembly in abutting contact against the rear side of the process-chamber ceiling are advantageously provided. This may take the form of large-surface-area engagement between a cooling surface of the cooling assembly and the rear side of the process-chamber ceiling. This makes it possible to solve problems which arise during the deposition of layers in the cold-wall reactor, that is to say in particular problems arising in MOCVD. When layers are deposited on a substrate lying on the floor of the process chamber, the process gases are pyrolytically reacted. The resulting solid crystallizes on the substrate. Parasitic growth on that surface of the floor of the process chamber which encloses the substrate, and forms a susceptor, is unavoidable. Although the ceiling of the reactor is cooled, it is also the case that parasitic growth is unavoidable there. The contamination resulting from parasitic growth forms consuming surfaces for the process gas introduced into the process chamber. This reduces the efficiency of the process and adversely affects the growth behavior of the layers which are to be deposited on the substrates. It is therefore necessary to clean the process chamber and, in particular, the surfaces which are adversely affected by parasitic growth. One method, which involves high outlay, consists in removing the appropriate parts of the reactor from the reactor and cleaning them separately from the reactor. Such process chambers have an exchangeable process-chamber floor and an exchangeable process-chamber ceiling. An alternative to this is in-situ cleaning by virtue of a suitable etching gas, possibly HCl, being introduced. This process, however, also requires the surfaces which are to be etched to be at a certain surface temperature. Heating up the heated process-chamber floor to the necessary etching temperature does not usually pose any problem. Problems arise in the case of a cooled process-chamber ceiling, since the latter can be heated substantially only by the radiation emanating from the process-chamber floor. These problems are overcome by way of the technical teaching specified in the claims. In order for the etching process to be carried out, the process-chamber ceiling is lowered into the vicinity of the process-chamber floor. As an alternative to this, however, it is also possible for the process-chamber floor to be raised into the vicinity of the process-chamber ceiling. A cooling means for cooling the process-chamber ceiling can maintain its distance from the floor during this vertical displacement either of the ceiling or of the floor, so that the process-chamber ceiling is effectively spaced apart from the cooling assembly. As an alternative to this, however, it would also be possible for the cooling means, in addition, to be moved away from the process-chamber ceiling. The cooling assembly preferably has a horizontal surface oriented downward in the direction of the floor. This horizontal surface runs parallel to a rear-side surface of the process-chamber ceiling. The latter is formed by a ceiling panel. The ceiling panel preferably rests in abutting contact against the cooling assembly. A floor or ceiling holder may be provided in order to support the ceiling or the floor of the process chamber within the reactor housing. One or both of these holders may be displaced vertically, so that the distance between the ceiling and floor of the process chamber can be reduced for the purpose of etching the latter. The ceiling panel may be round. However, it may also have the form of a circular disk in plan view. The inner edge of this circular-disk-shaped ceiling panel preferably rests on retaining means of an inner cylinder. The latter can be lowered by way of lifting means. The lifting means may be disposed in the center of the ceiling panel. Furthermore, a gas-inlet means may be located in the center of the process chamber. This is preferably fed from beneath with the process gases. The gas-inlet means may have a multiplicity of separate channels through which the process gases are introduced into the process chamber. The outlet openings associated with the individual channels may be located in each case on a lateral cylinder surface. This provides for rotational symmetry of the gas-outlet surfaces, which are all disposed one above the other. When the distance between the process-chamber ceiling and process-chamber floor is reduced, the outlet openings for the process gases are covered over, in part, by the inner wall of the inner cylinder. The HCl used for etching the process chamber can thus be introduced through these central feed lines, that is to say via the gas-inlet means, into the process chamber. The etching gas preferably exits out of the uppermost gas-outlet opening and then passes along the inner wall of the inner cylinder. It is then deflected into the horizontal direction and flows through the reduced-height process chamber, both the floor and the ceiling of the process chamber being etched. A variant provides for the gas-inlet means to be formed by the ceiling of the process chamber itself. The ceiling then forms a gas-outlet surface. The gas-outlet surface has a multiplicity of gas-outlet openings disposed in the manner of a shower head. It is also the case that such a process chamber is enclosed by a gas-collecting ring. Located above the ceiling is a usually water-cooled shower-head-like body with a gas plenum, which supplies the gas-outlet openings with gas. It is also possible, if required, for the etching gas to be introduced into the process chamber through this plenum. The process chamber, however, preferably has a central, separate feed line which extends through the floor of the process chamber and through which the etching gas is introduced into the process chamber.

Exemplary embodiments of the invention will be explained in more detail below with reference to accompanying drawings, in which:

FIG. 2 shows an illustration according to FIG. 1 with the ceiling panel lowered into the etching position;

FIG. 3 shows the section through a reactor housing of a second exemplary embodiment in the process position; and FIG. 4 shows an illustration according to FIG. 3 with the ceiling panel lowered into the etching position.

Figure 1:
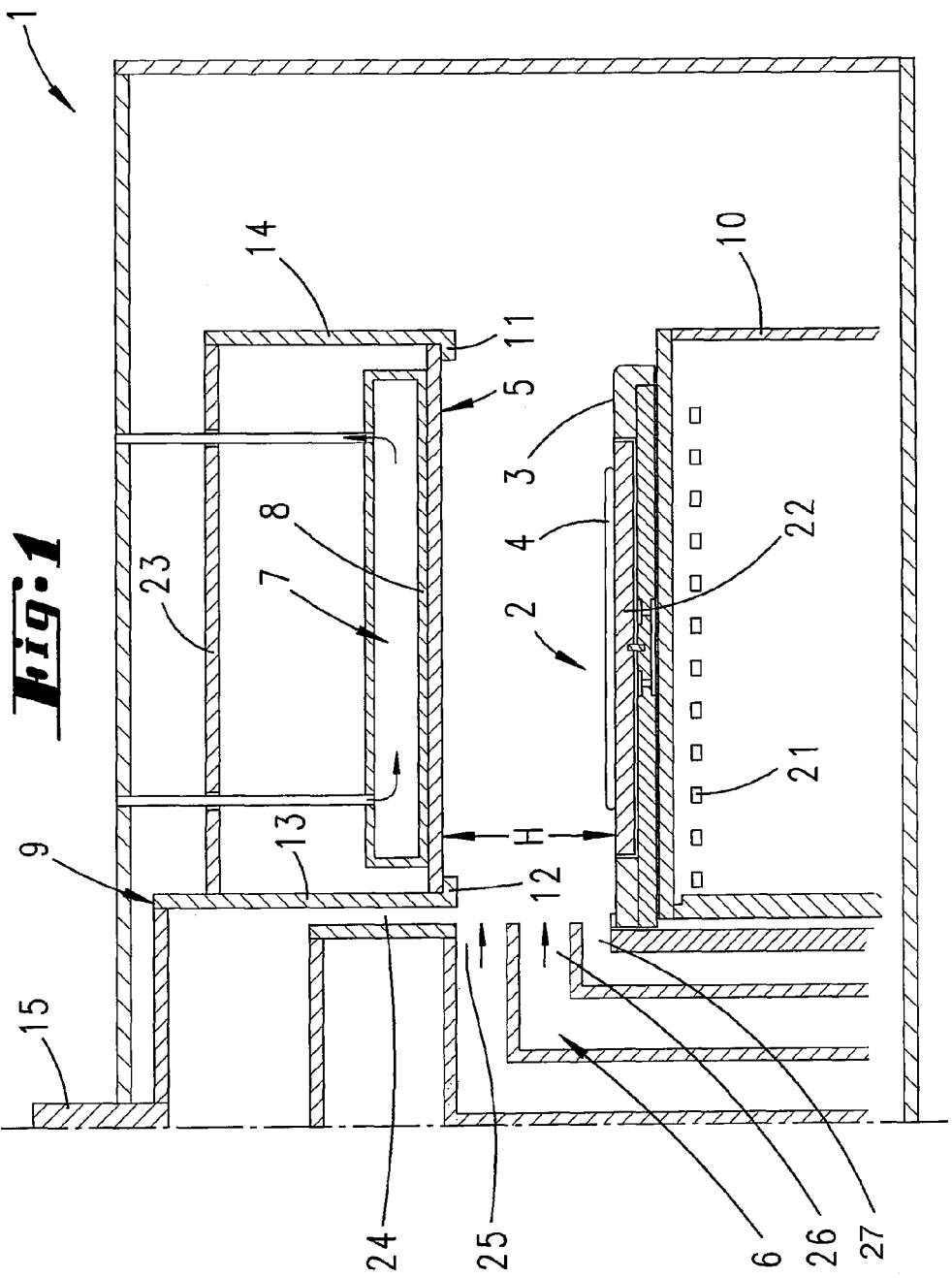
FIG. 1 shows the cross-section through half of a reactor housing of the first exemplary embodiment, with the ceiling panel located in the process position.

FIGS. 1 and 2 show a generally schematic illustration of the construction of a reactor housing 1. The latter has a floor 3, which may consist of graphite or some other suitable material, for example sapphire or quartz. The floor 3 rests on a floor carrier. A heater 21 is located beneath the floor carrier. This heater may be an RF heater or a resistance heater, and it heats up the floor 3 to the process temperature. The floor is carried by a floor holder 10.

The ceiling 5 of the process chamber is located at a distance H above the floor. The ceiling 5 comprises an annular panel 5 made of quartz, sapphire, graphite or some other suitable material. In the process position, which is illustrated in FIG. 1, this ceiling rests in abutting contact against a cooling surface 8, which is the underside of a cooling assembly 7. The floor 3 and ceiling 5 may be coated.

The cooling assembly 7 is a hollow body which has a cooling liquid flowing through it. The cooling assembly 7 is fixedly connected to the reactor housing 1. The inner edge of the ceiling panel 5 rests on a collar 12 of an inner cylinder 13. This inner cylinder 13 is part of a ceiling holder 9, which can be displaced in the vertical direction by a lifting means 15. The ceiling holder 9 also comprises an outer cylinder 14, which forms an inwardly directed collar 11 on which the outer edge of the ceiling panel 5 rests. The outer cylinder 14 is connected to the inner cylinder 13 by means of a transverse connection 23, so that the outer cylinder 14 and inner cylinder 13 can be lowered. As the outer cylinder 14 and inner cylinder 13 are lowered, the process-chamber ceiling 5 is spaced apart from the cooling surface 8. As the distance H decreases, the ceiling simultaneously moves toward a susceptor 22, which is part of the floor 3 and on which the substrate 4 is disposed during the process step.

The lifting means 15 is only schematically illustrated in the drawings. It may be in the form of a pneumatic cylinder. It is also conceivable to use a rack or lever mechanism.

The process chamber 2 which is illustrated in FIG. 1 has an annular configuration. A gas-inlet means 6 is located in the center of the process chamber 2 for the purpose of introducing the process gases. The process gases may be metal-organic compounds which transport an element of the third main group into the process chamber. Elements from the fifth main group are introduced in the form of hydrides into the process chamber. It is also possible, however, for the elements from the third main group to be introduced in the form of chlorides into the process chamber. The individual process gases are introduced into the process chamber 2 separately from one another through gas outlets 25, 26, 27, which are disposed one above the other. Introduction takes place in a rotationally symmetrical manner. A gap 24 which extends above the gas outlets 25, 26, 27, and is located between the inner cylinder 13 and upper part of the gas-inlet means 6, is flushed with an inert gas. During the coating process, the circular-disk-shaped susceptor 22, which is located in a recess of the floor panel 3, is rotated.

In order to carry out the etching process, during which there is no substrate 4 located in the process chamber 2, the ceiling holder 9 is lowered by way of the schematically illustrated lifting means 15. The ceiling panel 5, which has now been moved away from the cooling assembly 7, can be heated up as a result of the heat radiation coming from the floor and acting on the panel. An etching gas, for example HCl, is directed into the process chamber through the gas-inlet means 6. This preferably takes place through the uppermost gas-outlet opening 25, so that the etching gas flows vertically downward along the inner wall of the inner cylinder 13 before being deflected into the horizontal direction and flowing along above the floor 3 and over the underside 5' of the ceiling 5. Those surfaces of the floor 3 and ceiling 5 which are directed toward one another are thus etched. This results in the removal of material which is deposited there as a result of parasitic growth arising during the growth process.

FIGS. 3 and 4 illustrate a so-called shower-head reactor. This is also a CVD reactor in which layers are deposited on substrates 4 by means of process gases introduced into the process chamber 2. In this case, the gas-inlet means 6 extends over the entire surface area of the process chamber. The gas-inlet means 6 has a gas plenum with gas-outlet openings on its underside. The underside of the gas-inlet means 6 is a cooling surface 8. It is cooled by means of coolant. A ceiling panel 5 is located beneath this cooling surface 8. The ceiling panel 5 has a multiplicity of gas-outlet openings which are disposed in the manner of a screen and are aligned with gas-outlet openings of the cooling surface 8, so that the gas introduced into the gas-inlet means 6 through a gas inlet 20 can flow into the process chamber 2 through the gas-outlet openings 16.

In the process position, which is illustrated in FIG. 3, the ceiling panel 5, which consists of graphite, quartz, sapphire or some other suitable thermally conductive or thermally insulating material, rests in abutting contact against the cooling surface 8. For this purpose, the ceiling panel 5 rests on retaining protrusions 11 formed by a ceiling holder 9. The ceiling holder 9 can be lowered, so that the ceiling panel 5 can be moved toward the surface of the floor 3.

The floor 3 rests on a floor holder 10. Located beneath the floor 3 is a heater 21, which can heat the floor. The floor consists of graphite, quartz, sapphire or some other suitable material in order that the substrates 4 resting on the floor 3 can be heated.

The process chamber is enclosed by an annular gas-outlet ring 19, which can channel away reaction products or process gas which has not been used up.

Following completion of the coating process and removal of the substrates 4 from the process chamber 2, the ceiling holder 9 can be lowered by means of a lifting arrangement (not illustrated). The distance H between the floor 3 and ceiling 5 thus decreases. At the same time, the distance between the ceiling 5 and the cooling surface 8 increases, so that the ceiling 5 can heat up such that material deposited there can be removed by virtue of an etching gas being introduced.

The etching gas, which in this case too is preferably a chloride and, in particular, HCl, can be introduced into the process chamber through the gas-inlet means, that is to say through the gas inlet 20. The exemplary embodiment, however, provides for a feed line 18 through the floor 3, through which feed line 18 the etching gas can be introduced into the center of the process chamber.

It is also the case with the exemplary embodiment which is illustrated in FIGS. 3 and 4 that the substrates 4 can rest on rotatable susceptors. Here too, the floor 3 can be rotated as a whole about its axis.

In the two exemplary embodiments described above, the ceiling panel has been lowered for the purpose of reducing the distance between the ceiling 5 and floor 3. However, it is likewise possible in the two exemplary embodiments, by virtue of the floor holder 10 being configured correspondingly, for the floor 3 to be moved toward the ceiling 5. It is preferably the case, however, that, during this movement, a cooling assembly 7 or a cooling surface 8 is moved away from the ceiling panel 5. The lifting means for raising the floor 3 can thus simultaneously raise the cooling assembly 7 and the cooling surface 8. The distance between the cooling surface 8 or cooling assembly 7 and the floor 3 can remain unchanged during such vertical displacement.

It is considered to be particularly advantageous for the cooling assembly 7 to be fixedly disposed in the reactor housing. It may thus be at a fixed distance from the floor 3 of the process chamber. This distance need not be changed when the process-chamber ceiling 5 is lowered from a process position, which is illustrated in FIGS. 1 and 3, into a cleaning position, which is illustrated in FIGS. 2 and 4. In both cases, the distance H between the process-chamber floor 3 and process-chamber ceiling 5 decreases. In the same way, however, there is an increase in the distance between the rear side 5" of the process-chamber ceiling 5 and the cooling surface of the cooling assembly 7, this cooling surface being directed toward the rear side of the process-chamber ceiling. In the process positions, which are illustrated in FIGS. 1 and 3, the planar cooling surface of the cooling assembly 7 engages with surface contact against the rear side 5" of the ceiling. This ensures optimum removal of heat from the ceiling 5. The heat is transported away by means of the cooling liquid flowing through the cooling volume of the cooling assembly 7. Since cooling-surface abutment extends over virtually the entire surface area of the ceiling 5, it is possible for cold-wall growth to be carried out in the process chamber 2. It is nevertheless possible without deactivating the cooling assembly 7, in the position which is illustrated in FIGS. 2 and 4, for parasitic growth to be etched away from the process-chamber ceiling. In this cleaning position, the distance H between the ceiling 5 and the floor 3 of the process chamber 2 is less than the distance between the rear side 5" of the process-chamber ceiling 5 and the cooling surface 8 of the cooling assembly 7.

All features disclosed are (in themselves) pertinent to the invention. The disclosure content of the associated/attached priority documents (copy of the prior application) is hereby also included in full in the disclosure of the application, also for the purpose of incorporating features of these documents in claims of the present application.

The invention claimed is:

1. An apparatus for depositing one or more layers on a substrate (4), having a process chamber (2) disposed in a reactor housing (1), the process chamber (2) having a heatable floor (3) on which the substrate rests, a ceiling (5) parallel to the floor (3), and a gas-inlet means (6) for introducing process gases, it being possible for a distance (H) between the process-chamber ceiling (5) and the process-chamber floor (3) to be reduced to zero from a process position, in which layers are deposited on the substrate, to a cleaning position, in which the process chamber is cleaned, the apparatus characterized by a cooling assembly (7) disposed above the process-chamber ceiling (5) and by means of which the process-chamber ceiling (5), in the process position, is cooled as the layers are deposited, and further characterized by a distance between the cooling assembly (7) and the process-chamber ceiling (5) increasing as the distance (H) between the process-chamber ceiling (5) and the process-chamber floor (3) decreases.

2. An apparatus according to claim 1, further characterized in that the cooling assembly (7) has a cooling surface (8) extending parallel to the rear side (5") of the ceiling (5).

3. An apparatus according to claim 2, further characterized in that the cooling surface (8), in the process position, rests in abutting contact against the rear side (5") of the ceiling (5).

4. An apparatus according to claim 1, further characterized by a cooling surface (8) of the cooling assembly (7) which extends over substantially an entire rear side (5") of the ceiling (5) and rests in thermally conductive abutment against the ceiling (5).

5. An apparatus according to claim 1 further characterized in that the cooling assembly (7) forms hollow bodies through which a cooling liquid flows.

6. An apparatus according to claim 1 further characterized by a floor or ceiling holder (9, 10) which can be displaced in a vertical direction within the reactor housing (1).

7. An apparatus according to claim 6 further characterized by retaining means (11, 12) of the ceiling holder (9) which act on an edge of the ceiling (5).

8. An apparatus according to claim 6, further characterized by an annular ceiling panel, an inner edge of which rests on retaining means (12) of an inner cylinder (13) of the ceiling holder (9).

9. An apparatus according to claim 8, further characterized in that, in the cleaning position of the ceiling (5), the gas-inlet means (6) is covered over, at least in part, by the inner cylinder (13).

10. An apparatus according to claim 6, further characterized by an annular ceiling panel, an outer edge of which rests on retaining means (11) of an outer cylinder (14) of the ceiling holder (9).

11. An apparatus according to claim 6, further characterized by lifting means (15) which is disposed above the process chamber (2) and is intended for displacing the ceiling holder (9) vertically.

12. An apparatus according to claim 1, further characterized in that the ceiling (5) forms a gas-outlet surface of the gas-inlet means (6), with gas-outlet openings (16) disposed in the manner of a shower head.

13. An apparatus according to claim 1, further characterized by a gas-outlet opening (17) which is associated with the floor (3) and is intended for an etching gas.

* * * * *